United States Patent [19]

McMorrow, Jr. et al.

[11] Patent Number: 4,484,111
[45] Date of Patent: Nov. 20, 1984

[54] SIGNAL AMPLIFIER FOR A SIGNAL RECORDING DEVICE WITH MAGNETIC DEFLECTION

[75] Inventors: Richard H. McMorrow, Jr., Lincoln; Geoffrey Haigh, Boxford, both of Mass.

[73] Assignee: Analogic Corporation, Wakefield, Mass.

[21] Appl. No.: 415,979

[22] Filed: Sep. 8, 1982

Related U.S. Application Data

[63] Continuation of Ser. No. 186,536, Sep. 12, 1980, abandoned.

[51] Int. Cl.³ .................. H01J 29/70; H01J 29/76
[52] U.S. Cl. .................................. 315/397; 330/297
[58] Field of Search ............ 315/395, 396, 397, 403; 330/297

[56] References Cited

U.S. PATENT DOCUMENTS 3,725,727  4/1973  Waehner ........................... 315/389
3,733,514  5/1973  Garuts ............................. 315/403
4,023,069  5/1977  Peer ................................. 315/397
4,164,688  8/1979  Cushing ........................... 315/397

*Primary Examiner*—Theodore M. Blum
*Attorney, Agent, or Firm*—Weingarten, Schurgin, Gagnebin & Hayes

[57] ABSTRACT

The signal amplifier is used for amplification of an input signal with varying control amplitude, particularly in the field of electromedicine. The amplifier contains at least two amplification paths which supply current to the deflection coil of the recording device. In the first path is arranged a first individual amplifier which is designed as a voltage-controlled current source. It is rated for a lower control range. This lower range is chosen to be the range in which the input signal lies during relatively long periods of time. In the second path is arranged a second individual amplifier. This amplifier is designed as a voltage amplifier. It is rated for a higher control range and supplies the deflection coil with peak current during relatively short periods of time.

7 Claims, 2 Drawing Figures

SIGNAL AMPLIFIER FOR A SIGNAL RECORDING DEVICE WITH MAGNETIC DEFLECTION

This is a continuation, of application Ser. No. 186,536 filed Sept. 12, 1980 now abandoned.

BACKGROUND OF THE INVENTION

1. Field of the Invention

This invention relates to a signal amplifier for a signal recording device with magnetic deflection. In particular this invention relates to a vertical or y-amplifier for the vertical deflection coil of a magnetically deflecting oscilloscope. Still more particularly, this invention relates to a signal amplifier for medical technology, where, as signals of interest, signals representing a patient's physiological parameters are amplified, processed and displayed.

By the term "signal recording device with magnetic deflection" there are to be understood magnetically deflecting oscilloscopes in the broadest sense, but also printing devices with a magnetically deflected stylus or printing jet, such as rapid ink jet printers with magnetically deflectable nozzle for the ink jet. Such signal recording devices always have at least one deflection coil, which is controlled by an amplified driving or measuring signal.

2. Description of the Prior Art

Signal amplifiers of the above described kind must often process signals which contain a great variety of frequencies. In the field of electro-medicine, for instance, the main physiological parameters of a patient, as in particular blood pressure, respiration, EKG signals etc., comprise frequencies in the range between 0 and 100 Hz. If, however, extraordinary circumstances prevail, such as certain forms of arhythmia in the EKG, or if stimulation pulses are superposed on the input signal, as in particular pacemaker pulses in the EKG, the frequency range of the input signals will extend to still higher values, e.g. as high as 300 Hz or more. Generally, high frequencies mean high signal amplitudes. If it is desired that such high signal amplitudes are to be reproduced on the signal recording device largely undistorted, the signal amplifier must be designed for as wide as possible a control range. Design for a wide control range, however, will increase the power requirement of the amplifier, since high signal amplitudes require high deflection currents in the deflection coil.

SUMMARY OF THE INVENTION

1. Objects

It is an object of this invention to provide a signal amplifier of the above mentioned kind which combines a wide control range with low power requirements.

It is another object of this invention to provide a signal amplifier for a signal recording device such as an oscilloscope which is enabled to display or record signals which are located in different frequency ranges, with low power requirements.

2. Summary

According to this invention, the signal amplifier is divided into several amplification paths which are connected to the deflection coil to be driven. In the amplification paths, individual amplifiers with different control ranges are disposed, whereby those control ranges are adapted to the input signal the amplitude of which may occur in various ranges. At least one individual amplifier is rated for a lower control range in which the input signal chiefly occurs during relatively long periods of time. This amplifier is designed as a voltage-controlled current source. It is from this amplifier that the deflection coil derives its main deflection current. The other individual amplifier or amplifiers in the remaining amplification paths is/are, instead, pure voltage amplifier(s) which is/are related for a higher control range or higher control ranges. This amplifier or these amplifiers supply the deflection coil with peak current only during those relatively short periods of time when the input signal exceeds its main range.

The invention is based on the realization that the input signals to be amplified by a signal amplifier before recording on a recording device can be grouped in certain ranges with respect to their frequency components. For all input signals there always exists a main frequency range having relatively fixed limits which covers the frequency components occurring most frequently. All other frequencies, lying outside this main frequency range, occur much more rarely. Hence, over time the main frequency range is relatively seldom exceeded. Experience has shown that signals which are obtained in particular in electromedicine frequently have relatively low frequencies in the range of small amplitudes. In the range of medium to high amplitudes, instead, medium to high frequencies occur more frequently. Small amplitudes mean a low control range, whereas higher amplitudes mean a higher control range.

The signal amplifier according to the invention operates as a pure voltage to current transformer or converter precisely in the range of low frequencies which constitute the major part of all the frequencies which occur. Already at a relatively low input or operating voltage of the voltage-controlled current source, which is located in a first of the amplification paths, a high output current for the deflection coil is supplied from this first amplification path. If the input signal has high amplitude (signal peaks), the high output current of the current source includes the bulk of the average current required by the deflection coil. To this high current is added peak current. This peak current is supplied to the deflection coil by the voltage amplifier(s) in the other amplification path(s). It is supplied relatively rarely and only for short times, namely when the input signal contains medium to high frequency components in the form of signal peaks. Such signal peaks appear in physiological signals. E.g., in an EKG, they occur periodically, however, always only briefly as normal R peaks with medium frequency components up to about 100 Hz. Signal peaks with higher frequency components, i.e. to about 300 Hz, are usually arhythmic phenomena or interfering pacemaker pulses.

The signal amplifier according to the invention is therefore designed for a wide control range. Accordingly it processes signals of a relatively wide frequency spectrum. Yet, the power consumption is a minimum, because the voltage required to produce the main current is low, and because peak currents require medium to high voltages only during relatively short periods of time.

In a preferred embodiment of the invention, the individual amplifier operating as voltage-controlled current source is uncoupled or blocked from the peak current(s) of the deflection coil by an auxiliary coil. As compared with the inductance of the deflection coil, this auxiliary coil should have a much higher inductance, e.g., up to five times the inductance of the deflection coil. In a signal amplifier for electromedical purposes, which supplies a deflection coil having an inductance of 113 $\mu H$, for instance, the inductance of the auxiliary coil may preferably be 500 $\mu H$. This inductance of the auxiliary coil is still small enough to ensure that the deflection coil is rapidly supplied with the required main current in the main frequency range of the input signal even at lowest operating voltage of the amplifier operating as voltage-controlled current source. On the other hand, this inductance is great enough to prevent the drainage of any appreciable amount of the peak currents from the voltage amplifiers into the other amplification paths via the auxiliary coil. More generally speaking, the inductance of the auxiliary coil may be between 450 and 600 $\mu H$, when the inductance of the deflection coil is between 90 and 120 $\mu H$.

Another preferred embodiment of the invention refers to a conventional signal recording device which has a maximum range of an operating voltage, in particular to a magnetically deflecting osclloscope. The maximum range is divided into a predetermined number of sub-ranges. The maximum range and the sub-ranges are assigned to the individual amplifiers in such a way that the amplifier operating as voltage-controlled current source is designed for the lowest operating voltage range, and each of the amplifiers for the pure voltage amplification are designed for one of the next higher voltage ranges. Specifically for electromedical purposes, the operating voltage range may be limited by $-15$ V and $+15$ V, aand there may be three ranges $\pm 2$ V, $\pm 5$ V, and $\pm 15$ V. The amplifier operating as voltage-controlled current source is then designed for the lowest sub-range $\pm 2$ V, and either one two-step voltage amplifier or two one-step voltage amplifiers are provided which cover(s) in two steps the ranges $\pm 5$ V and $\pm 15$ V.

The foregoing and other objects, features and advantages of the invention will be apparent from the following more particular description of the preferred embodiments of the invention, as illustrated in the accompanying drawings.

DETAILED DESCRIPTION OF THE PREFERRED EMBODIMENT

Figure 1:
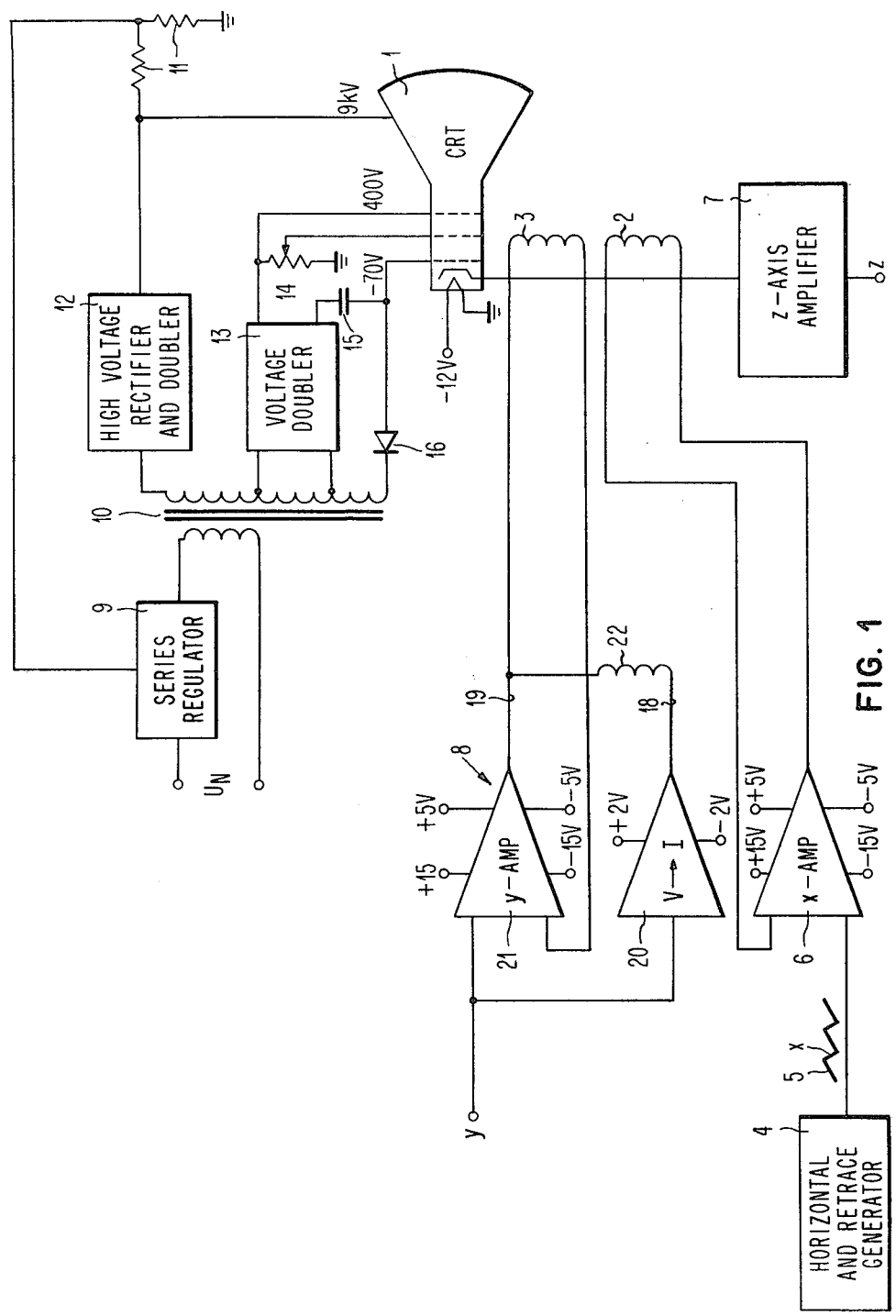
FIG. 1 shows a signal amplifier according to the invention applied to a magnetically deflecting oscilloscope, in a basic circuit diagram.

According to FIG. 1, a cathode ray tube 1 comprises a magnetically deflecting system containing an x-deflection coil or horizontal deflection coil 2 and a y-deflection coil or vertical deflection coil 3. The horizontal deflection coil 2 may have an inductance of preferably 18.28 mH ($\pm 10\%$). The inductance of the vertical deflection coil 3 may preferably be 113 $\mu H$ ($\pm 10\%$). The ramp voltage for the x-deflection of the electron beam of the tube 1 is supplied by a horizontal deflection generator 4. In FIG. 1, the x-raster voltage is indicated by the reference numeral 5. Device 6 is an x-amplifier for the x-ramp voltage 5. Block 7 is a well-known z-amplifier for the z-signals of the cathode ray tube 1.

Besides a signal amplifier 8, which is designed in accordance with the invention and which is used here as a vertical amplifier or y-amplifier of the tube 1 for the y-deflection signals, the circuitry of the cathode ray tube 1 comprises additionally circuit elements for the generation of supply voltages for the various grids of the tube 1.

The most important elements for the generation of grid voltages are a series regulator 9 for the output voltage $U_N$ of a current supply unit (not shown) on the primary side of a transformer 10, which operates in conjunction with a voltage divider 11, and on the secondary side of the transformer 10 a high-voltage rectifier 12 for an anode voltage of 9 kV, for instance, as well as a voltage doubler 13. The voltage doubler 13 supplies a first grid voltage, which may have, for example, 400 V. From this first grid voltage a second grid voltage is tapped via a potentiometer 14 for adjustment of the foucs. An auxiliary circuit consisting of a capacitor 15 and a diode 16 delivers a third grid voltage, which may have $-70$ V, for example. The heating cathode of the tube 1 is designated with 17. The cathode may be connected to $-12$ V.

In FIG. 1, the vertical amplifier 8 according to the invention comprises a total of two amplification paths 18 and 19, which are connected parallel to each other. In the first amplification path 18 a first individual amplifier 20 is disposed, which operates in the operating voltage range or control range $\pm 2$ V. This range defines the lowest operating voltage range. In this lowest range voltage-current transformation is effected. The first amplifier 20, therefore, is designed as a voltage-controlled current source. As indicated by the symbol V$\rightarrow$I, this first amplifier 20 supplies, for input voltage signals comprised in the relatively narrow operating voltage range from approximately $-2$ V to $+2$ V, a relatively high deflection current for the y-deflection coil 3 of the cathode ray tube 1. As far as the electromedical field is concerned, the major part of all physiological signals lies in this small voltage range of approximately $\pm 2$ V in terms of frequency and control. The y-signal amplifier 8 thus operates mostly in the current transformer mode with a high main or base current, whereby only a low operating voltage is required. Accordingly, it operates in this lowest range very effectively at relatively low power consumption.

For the processing of signal peaks, which occur only relatively briefly and with medium to high frequency components, e.g. R peaks and/or pacemaker pulses in the EKG, the circuit includes the second signal or amplification path 19 of the y-amplifier 8. In the second amplification path 19 is inserted a second individual amplifier 21. This second individual amplifier 21 is a pure voltage amplifier, specifically a true feedback control amplifier, which can operate within two operating voltage ranges $\pm 5$ V and $\pm 15$ V. The range $\pm 15$ V is the maximum operating voltage range of the signal amplifier, and $\pm 2$ V, $\pm 5$ V are the two sub-ranges. Thus, while the first amplifier 20 operating as voltage-controlled current source will process input signals in the range between $-2$ V and $+2$ V, the second amplifier 21 will become active whenever signal peaks exceed the lowest range of $\pm 2$ V. The transition between the three ranges $\pm 2$ V, $\pm 5$ V and $\pm 15$ V is gradual. This means that for signals in the control range $\pm 2$ V, the first amplifier 20 as well as the second amplifier 21 will be addressed equally by these signals, but as has been set forth above, the y-deflection coil 3 is supplied in the ±2 V range mainly with current originating from the first amplifier 20 of the first amplification path 18. By comparison, the current supplied in the ±2 V range by the voltage amplifier 21 is negligibly small.

When, however, certain signal components exceed the lowest control range ±2 V, the voltage amplifier 21 will slidingly take over the peak current supply in ascending steps of ±5 V (for the medium control range) and ±15 V (for the high control range) in addition to the basic current supply, which continues to be provided by the first amplifier 20 operating as current source.

In order to prevent, during times of peak current requirement, the peak current from flowing from the pure voltage amplifier 21 to the current source amplifier 20, the two amplifiers are uncoupled on their output sides by an auxiliary coil 22. The auxiliary coil 22 may have an inductance of 500 μH. Accordingly, it offers a high resistance to the peak currents which are derived from the medium and high frequency components. Moreover, the voltage amplifier 21 has an amplification which is slightly above the amplification of the amplifier 20. This measure supports the sliding transition from main current supply to peak current supply.

Figure 2:
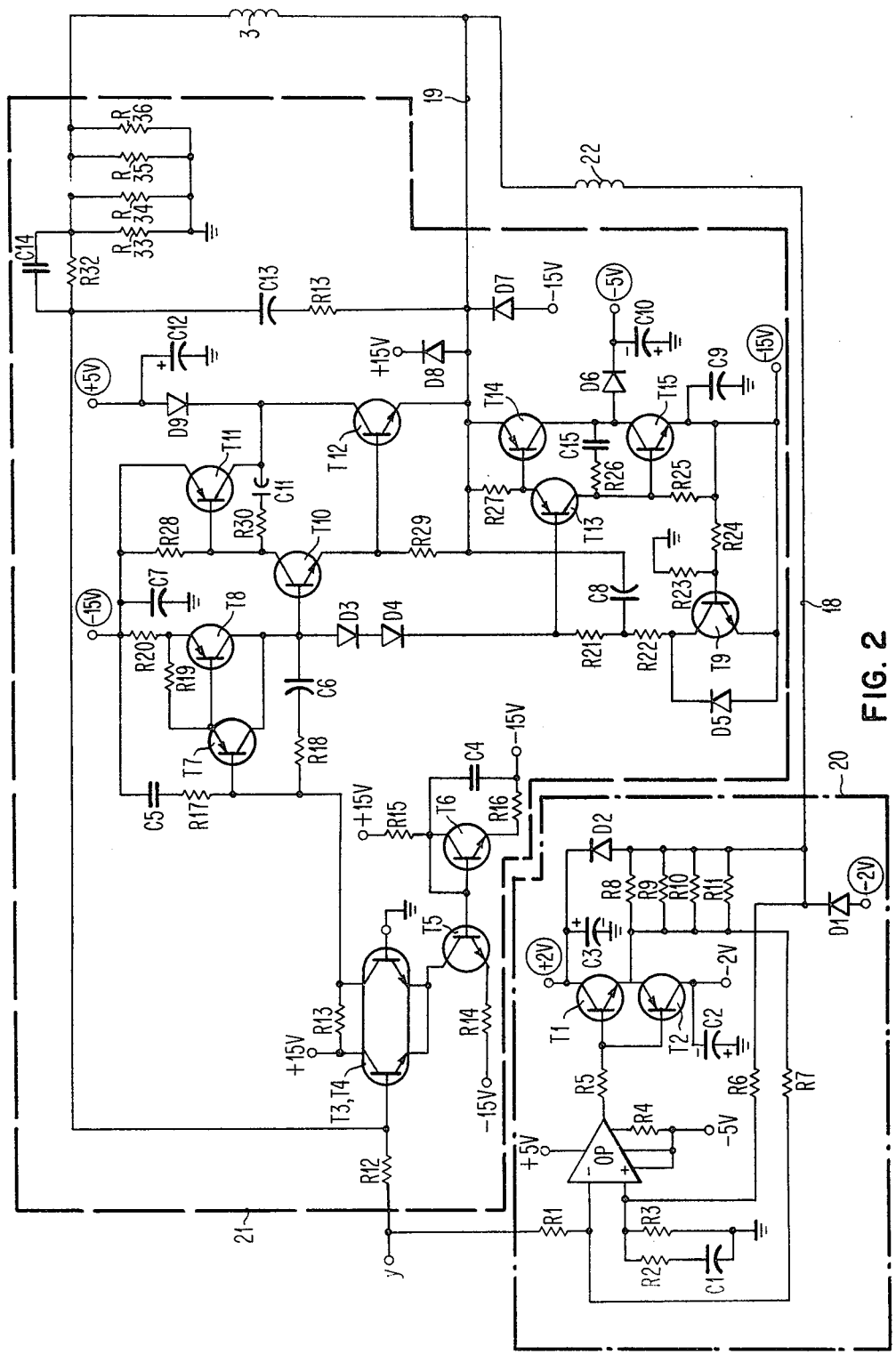
FIG. 2 shows an embodiment of the signal amplifier according to the invention in detailed circuit arrangement.

FIG. 2 illustrates details of an embodiment of the y-signal amplifier 8. The amplifier 20 operating as voltage-controlled current source is assembled in the manner illustrated from an operation amplifier OP, transistors T1, T2, ohmic resistors R1 to R11, capacitors C1 to C3, and diodes D1, D2. The voltages −2 V and +2 V enclosed in circles are the operating voltages of the lower control range for the low-frequency components forming the major portion of the signals. The amplifier 21 operating as voltage amplifier is composed of transistors T3 to T15, ohmic resistors R12 to R36, capacitors C4 to C14, and diodes D3 to D9. The two operating voltage steps ±5 V and ±15 V for medium and high frequency components of the input signal are marked by circles. In the circuitry shown, the transistors T3, T4 form an asymmetrical differential amplifier, and the transistors T7 and T8 operate as drivers.

The gliding transition between the ranges ±5 V and ±15 V is achieved by a special circuit. In this special circuit, the ohmic resistor R29 in the base-emitter circuit of transistor T12 is selected to have a higher value than the ohmic resistor R28 in the base-emitter circuit of the transistor T11. Preferably, the resistance of the resistor R29 is double the resistance of the resistor R28.

If the control range ±2 V of the amplifier 20 forming the voltage-controlled current source is exceeded by a signal peak of the input signal y, the transistor T10 will be increasingly controlled conducting by the voltage peak. The collector-emitter path of transistor 10 carries current which produces a greater voltage drop at the resistor R29 of the higher value than at the resistor R28 of the lower value. The result is that the transistor T12 becomes conducting and that the amplifier 21 is thereby switched to the medium operating voltage range ±5 V. This operational state, however, is maintained only for signal peaks in the medium frequency range. For signal peaks of the higher frequency range, the transistor 10 will be controlled such that there results a relatively high transistor current. At the resistor R28 this current will cause a voltage drop which is sufficient to drive the transistor T11 into the current carrying condition. Hence, the transistor T11 will now become conducting, and thus the amplifier 21 will be switched to the range of the highest operating voltage ±15 V.

While the forms of the signal amplifier herein described constitute preferred embodiments of the invention, it is to be understood that the invention is not limited to these precise forms of assembly, and that a variety of changes may be made therein without departing from the scope of the invention.

What is claimed is:

1. Apparatus for limiting the power necessary to linearly drive a magnetic deflection coil in accordance with an input signal having a wide range of frequency components, comprising:

a source of differing supply voltages;

a voltage-to-current converting amplifier coupled to and powered by one of the supply voltages from said source for amplifying said input signal, said voltage-to-current converting amplifier adapted to be connected to said deflection coil so that said coil receives its main current from said voltage-to-current converting amplifier, said voltage-to-current converting amplifier having a predetermined input signal voltage range corresponding to input signals having components in a relatively low frequency range, said input signal range being determined by the supply voltage coupled to said voltage-to-current amplifier; and, a multi-step voltage amplifier for amplifying said input signal, said multi-step voltage amplifier coupled to and powered by a number of different supply voltages from said source and providing an output voltage capable, by virtue of the provision of different supply voltages, of swinging between different voltage level steps corresponding to different input signal voltage ranges which correspond to input signals having frequency components higher than those associated with the input signal voltage range of said voltage-to-current converter, said different input signal voltage ranges being higher than said predetermined input signal voltage range, said multi-step voltage amplifier adapted to be connected to said deflection coil for driving said deflection coil such that current through the coil generated as a result of multi-step amplifier drive is added to the current from said voltage-to-current converting amplifier, each step being activated when said input signal voltage exceeds the limit of the next lower input signal voltage range.

2. The apparatus of claim 1 and further including an auxiliary coil between the outputs of said voltage-to-current converting amplifier and said multi-step voltage amplifier, said auxiliary coil having an inductance greater than that of said deflection coil.

3. The apparatus of claim 1 wherein said multi-step voltage amplifier includes an assembly of a first, a second and a third transistor for achieving a transition from a one input signal voltage range to a higher input signal voltage range, wherein said first transistor is a control transistor supplied by signal peaks of said input signal, wherein said second transistor is a transistor for said one voltage range, wherein said third transistor is a transistor for a higher input voltage range, wherein a first and a second resistor are provided, wherein said first resistor is disposed in the base-emitter circuit of said second transistor, wherein said second resistor is disposed in the base-emitter circuit of said third transistor, wherein the resistance of said first resistor is greater than the resistance of said second resistor, wherein said control transistor is connected with its collector-emitter path in the current path between said first and said second resistor such that it is controlled increasingly conducting with increasing signal peaks, thereby carrying current increasingly, whereby said current produces at said first resistor a higher voltage drop than at said second resistor, which higher voltage drop will first drive said second transistor into its current carrying status, while said third transistor will be driven into its current carrying status when a higher signal peak drives said first transistor to such an extent that it will carry so high a current which at the second resistor leads to a voltage drop which is large enough to drive the third transistor to its current carrying status.

4. Apparatus for limiting the power necessary to linearly drive a magnetic deflection coil in accordance with an input signal having a wide range of frequency components comprising:

a source of differing supply voltages; and a multi-step voltage amplifier coupled to said source for amplifying said input signal, said amplifier adapted to be connected to said deflection coil such that current is generated in said coil as a result of the application of voltage from said amplifier through said coil, the steps of said amplifier corresponding to different input signal ranges and corresponding different frequency component ranges, each step being activated by the application to the amplifier of an increased supply voltage when the voltage associated with said input signal exceeds the limit of the next lower range such that each higher step is actuated with the presence of higher frequency components in said input signal.

5. The apparatus of claim 4 wherein said amplifier includes at least one circuit for establishing the level of said input signal within a predetermined range and means for effectively increasing the voltage supply limits to said amplifier when said input signal is outside of said predetermined range, thereby to establish a higher output signal range for said amplifier.

6. A signal amplifier for the amplification of an input signal with varying control amplitude for a signal recording device having a magnetic deflection coil, comprising:

a plurality of amplification paths connected for supplying current to said deflection coil; and, a plurality of individual amplifiers disposed in said amplification paths, said amplifiers having control ranges which are different from each other and which are adapted to said input signal, said control ranges containing a lower control range in which said input signal lies during relatively long periods of time and at least one higher control range in which said input signal lies during relatively short periods of time, wherein at least one of said individual amplifiers in one of said amplification paths is designed as a voltage-controlled current source and is rated for said lower control range in such a way that in the course of time said deflection coil will receive its main current from said amplifier, wherein at least a further individual amplifier in a remaining amplification path is designed as voltage amplifier, which is rated for said one higher control range and which supplies said deflection coil with peak current during said relatively short periods of time in which said input signal exceeds said lower control range, wherein said signal recording device is a conventional signal recording device which is controlled by an operating voltage from said amplification paths, wherein said recording device has a maximum range which should not be exceeded by said operating voltage, wherein said maximum range is divided into a predetermined number of voltage sub-ranges, said maximum range and said sub-ranges being said control ranges, and wherein said maximum range and said sub-ranges are assigned to said individual amplifiers in such a way that said individual one amplifier being a voltage-controlled current source is designed for the lowest voltage sub-range and that an individual amplifier for the voltage amplification is designed for the higher voltage sub-ranges, such that for several ranges of said operating voltage only a first and a second individual amplifier are provided, wherein said first amplifier operates as said voltage-controlled current source in the lowest voltage range, and wherein said second amplifier is a multi-step voltage amplifier which is activated, starting from its lower voltage range, in a step to its next higher voltage range when said input signal exceeds the limits of said lower voltage range, wherein an assembly of a first, a second and a third transistor is provided in said second amplifier for achieving a transition from a medium range voltage to a highest voltage range, wherein said first transistor is a control transistor supplied by signal peaks of said input signal, wherein said second transistor is a transistor for a medium voltage range, wherein said third transistor is a transistor for a highest voltage range, wherein a first and a second ohmic resistor are provided, wherein said first resistor is disposed in the base-emitter circuit of said second transistor, wherein said second resistor is disposed in the base-emitter circuit of said third transistor, wherein the resistance of said first resistor is greater than the resistance of said second resistor, wherein said control transistor is connected with its collector-emitter path in the current path between said first and said second resistor such that it is controlled increasingly conducting with increasing signal peaks, thereby carrying current increasingly, whereby said current produces at said first resistor a higher voltage drop than at said second resistor, which higher voltage drop will first drive said second transistor into its current carrying status, while said third transistor will be driven into its current carrying status when a higher signal peak drives said first transistor to such an extent that it will carry so high a current which at the second resistor leads to a voltage drop which is large enough to drive the third transistor to its current carrying status.

7. The signal amplifier according to claim 6, wherein the resistance of said first resistor is approximately twice as large as the resistance of the said second resistor.

* * * * *